United States Patent
Ali

(10) Patent No.: US 10,181,843 B2
(45) Date of Patent: Jan. 15, 2019

(54) ADAPTIVE CONTROL OF THE NON-OVERLAP TIME OF POWER SWITCHES

(71) Applicant: Dialog Semiconductor (UK) Limited, London (GB)

(72) Inventor: Shafqat Ali, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/813,425

(22) Filed: Nov. 15, 2017

(65) Prior Publication Data

US 2018/0294804 A1  Oct. 11, 2018

(30) Foreign Application Priority Data

Apr. 6, 2017  (DE) .................. 10 2017 205 919

(51) Int. Cl.

| H03K 3/00 | (2006.01) |
| H03K 5/151 | (2006.01) |
| H02M 1/38 | (2007.01) |
| H03K 5/156 | (2006.01) |
| H02M 3/157 | (2006.01) |
| H03K 5/1534 | (2006.01) |
| H02M 3/158 | (2006.01) |

(52) U.S. Cl.
CPC ............ *H03K 5/1515* (2013.01); *H02M 1/38* (2013.01); *H02M 3/157* (2013.01); *H02M 3/1582* (2013.01); *H03K 5/1534* (2013.01); *H03K 5/1565* (2013.01)

(58) Field of Classification Search
CPC .................................................... H03K 5/1515
See application file for complete search history.

(56) References Cited

U.S. PATENT DOCUMENTS

| 2010/0156366 A1* | 6/2010 | Sakai ................. H02M 3/1588 323/282 |
| 2015/0061639 A1 | 3/2015 | Webster et al. |
| 2015/0160669 A1 | 6/2015 | Marschalkowski et al. |

FOREIGN PATENT DOCUMENTS

| DE | 10 2011 120 841 | 6/2013 |
| DE | 10 2015 115 338 | 3/2017 |

OTHER PUBLICATIONS

German Office Action, Reference No. 10 2017 205 919.2, Applicant: Dialog Semiconductor (UK) Limited, dated Nov. 21, 2017, 9 pgs, and English language translation, 11 pgs.

* cited by examiner

*Primary Examiner* — Daniel Puentes
(74) *Attorney, Agent, or Firm* — Saile Ackerman LLC; Stephen B. Ackerman

(57) ABSTRACT

Circuitry for controlling a non-overlap time for a first switch and a second switch is described. Within a first state, the first switch is closed and the second switch is open, and within a second state, the first switch is open and the second switch is closed. The control circuitry has a first auxiliary switch and a second auxiliary switch. The control circuitry determines whether during a transition from the first state to the second state a current has flown through the serial arrangement of the first and second auxiliary switches. The control means adapts a non-overlap time between the first and second control signals for controlling a following transition from the first state to the second state, dependent on whether during said transition between the first and second states a current has flown through the serial arrangement of the first and second auxiliary switches.

20 Claims, 10 Drawing Sheets

ADAPTIVE CONTROL OF THE NON-OVERLAP TIME OF POWER SWITCHES

TECHNICAL FIELD

The present document relates to the control of the non-overlap time, NOT, of power switches, notably in the context of switched-mode power converters.

BACKGROUND

A switched-mode power converter typically comprises a high side (HS) switch and a low side (LS) switch which are arranged in series between a HS voltage and a LS voltage. The HS switch and the LS switch are closed in a mutually exclusive manner, in order to couple the midpoint between the HS switch and the LS switch, which is typically referred to as the Lx node, to the HS voltage or to the LS voltage in a mutually exclusive manner. The transition between the HS period, during which the HS switch is closed and the LS switch is open, and the LS period, during which the HS switch is open and the LS switch is closed, typically comprises a NOT period, during which the HS switch and the LS switch are both closed. By doing this, a short circuit between the HS voltage and the LS voltage and related damages to the power converter can be avoided.

On the other hand, during the NOT period, a current may flow through the body diodes of transistor-based HS switches and/or LS switches, causing an increased power dissipation. Hence, a relatively long NOT period typically leads to a reduction of the power efficiency of a power converter.

SUMMARY

The present document addresses the technical problem of adapting the NOT in an efficient, precise and adaptive manner, in order to reduce the NOT (for increasing power efficiency), while at the same time ensuring safe operation of a serial switch arrangement comprising a HS switch and a LS switch. According to an aspect, control circuitry for controlling a non-overlap time (NOT) for a first switch and a second switch is described. The first switch and the second switch are arranged in series and are controlled using a first control signal and a second control signal, respectively. The first switch and the second switch may be arranged in series between a first voltage (e.g. an input voltage or an output voltage of a power converter) and a second voltage (e.g. ground). The first switch may be the HS switch of a half bridge and the second switch may be the LS switch of the half bridge (or vice versa). The first and second switches may be power switches and/or metal oxide semiconductor (MOS) field effect transistors (FET).

Within a first state, the first switch is closed and the second switch is open, and within a second state, the first switch is open and the second switch is closed. The first switch and the second switch may be controlled to be alternatingly in the first state and in the second state. This may be achieved using pulse width modulated (PWM) first and second control signals, respectively. As such, the first and second control signals may each comprise rising and falling edges for closing or opening the respective first and second switches. Corresponding edges of the control signals for performing a transition from a first state to a second state or a transition from a second state to the first state should be as close as possible, in order to reduce power dissipation. On the other hand, the corresponding edges should have sufficient delay or non-overlap time from one another, in order to avoid a short-circuit situation where the first switch and the second switch are both closed at the same time. The delay between corresponding edges of the first and second control signals may be referred to as non-overlap time (NOT).

The control circuitry comprises a first auxiliary switch and a second auxiliary switch, which are arranged in series. The first auxiliary switch may be a (scaled) replica of the first switch and the second auxiliary switch may be a (scaled) replica of the second switch. Hence, a (possibly) scaled copy of the serial arrangement of the first and second switches may be provided. The serial arrangement of the first auxiliary switch and the second auxiliary switch may be arranged between a first auxiliary voltage and a second auxiliary voltage. The first auxiliary voltage may be provided by a storage unit. The second auxiliary voltage may correspond to ground.

The first auxiliary switch and the second auxiliary switch are controlled using a first auxiliary control signal and a second auxiliary control signal, respectively, which are dependent on the first control signal and the second control signal, respectively.

The first auxiliary control signal and the second auxiliary control signal may be derived from the first control signal and the second control signal such that a duty cycle of the first auxiliary control signal is equal to a duty cycle of the first control signal, and such that a duty cycle of the second auxiliary control signal is equal to a duty cycle of the second control signal. On the other hand, a delay or non-overlap time of the first auxiliary control signal relative to the second auxiliary control signal may be offset by a control signal delay $t_d$ compared to a delay or non-overlap time of the first control signal relative to the second control signal. Alternatively or in addition, the first auxiliary control signal relative to the second auxiliary control signal may be offset by a control signal delay $t_d$. In particular, the first auxiliary control signal may be equal to the first control signal and the second auxiliary control signal may be equal to the second control signal delayed by a control signal delay $t_d$. By using auxiliary control signals with a modified delay, an overlap time of the auxiliary switches may be generated, even though the main switches, i.e. the first switch and the second switch, do not yet exhibit an overlap time. Hence, a precise and safe control of the non-overlap time of the main switches may be provided (because the overlap of the auxiliary switches may be detected without the risk of an overlap of the main switches).

The control circuitry comprises control means which are configured to determine whether during a transition from the first state to the second state a current has flown through the serial arrangement of the first auxiliary switch and the second auxiliary switch. By way of example, the control circuitry may comprise a detection resistor which is arranged in series with the serial arrangement of the first auxiliary switch and the second auxiliary switch, e.g. between the first auxiliary voltage and the second auxiliary voltage. As a result of this, a current through the serial arrangement of the first auxiliary switch and the second auxiliary switch causes a voltage drop at the detection resistor, wherein the voltage drop may be detected. Alternatively or in addition, a current through the serial arrangement of the first auxiliary switch and the second auxiliary switch would cause a reduction or glitch of the voltage level at the intermediate node between the detection resistor and the serial arrangement of the first auxiliary switch and the second auxiliary switch. The voltage level at the intermediate node could be detected.

In other words, the control circuitry may comprise a detection resistor which is arranged in series with the serial arrangement of the first auxiliary switch and the second auxiliary switch. A resistance of the detection resistor is preferably larger than an on-resistance of the serial arrangement of the first auxiliary switch and the second auxiliary switch. Furthermore, the control circuitry may comprise means for detecting a voltage at the intermediate node between the detection resistor and the serial arrangement of the first auxiliary switch and the second auxiliary switch, notably during a transition from the first state to the second state. A drop of the voltage level at the intermediate node may be registered. Hence, it may be detected in an efficient manner whether during a transition from the first state to the second state a current has flown through the serial arrangement of the first auxiliary switch and the second auxiliary switch.

The control means are further configured to adapt a non-overlap time between the first control signal and the second control signal for controlling a following transition from the first state to the second state, dependent on whether during said transition from the first state to the second state a current has flown through the serial arrangement of the first auxiliary switch and the second auxiliary switch.

Hence, the non-overlap time between the first switch and the second switch may be adapted in an efficient and precise manner, based on the detection of a current flow through the serial arrangement of the first auxiliary switch and the second auxiliary switch.

The control circuitry may comprise a storage unit which is configured to store electrical energy prior to a transition from the first state to the second state. In particular, a default amount of energy may be stored within the storage unit. The storage unit may comprise a capacitor and the control circuitry may comprise a capacitor switch which is configured to couple the capacitor with a supply for a default voltage prior to said transition. Hence, a storage voltage of the storage unit may be charged to a default voltage prior to a transition from the first state to the second state.

The storage unit may be such that the storage unit is discharged if the first auxiliary switch and the second auxiliary switch are closed concurrently. By way of example, the storage unit may be discharged to ground. The discharging of the storage unit via the serial arrangement of the first auxiliary switch and the second auxiliary switch may occur in accordance to a particular time constant. By way of example, the storage voltage at the storage unit may decrease with a particular time constant. Hence, the charging situation of the storage unit, in particular the storage voltage of the storage unit, may be indicative of the time during which the storage unit has been discharged.

The control means may be configured to determine, subsequent to said transition from the first state to the second state, whether the storage unit has at least partially been discharged (i.e. whether the energy stored within the storage unit is lower than the default energy). Such discharging may have been caused by an overlap time of the first and second auxiliary switches. In particular, the only possible cause for such discharging may have been an overlap time of the first and second auxiliary switches. The actual amount of energy that has been discharging may be indicative of the actual overlap time of the first and second auxiliary switches.

The control means may further be configured to adapt the delay or non-overlap time between the first control signal and the second control signal (and by consequence the delay between the first auxiliary control signal and the second auxiliary control signal) for controlling a following transition from the first state to the second state, dependent on whether the storage unit has at least partially been discharged.

In particular, the delay or non-overlap time between the first control signal and the second control signal (and by consequence the delay between the first auxiliary control signal and the second auxiliary control signal) may be increased, if it is determined that during said transition from the first state to the second state a current has flown through the serial arrangement of the first auxiliary switch and the second auxiliary switch (e.g. that the storage unit has at least partially been discharged). On the other hand, the delay between the first control signal and the second control signal (and by consequence the delay between the first auxiliary control signal and the second auxiliary control signal) may be decreased, if it is determined that during said transition from the first state to the second state no current has flown through the serial arrangement of the first auxiliary switch and the second auxiliary switch (e.g. that the storage unit has not been discharged).

Alternatively or in addition, the delay or non-overlap time between the first control signal and the second control signal (and by consequence the delay between the first auxiliary control signal and the second auxiliary control signal) may be increased, if it is determined that during said transition from the first state to the second state a current has flown through the serial arrangement of the first auxiliary switch and the second auxiliary switch, which is greater than a current threshold. On the other hand, the delay between the first control signal and the second control signal (and by consequence the delay between the first auxiliary control signal and the second auxiliary control signal) may be decreased, if it is determined that during said transition from the first state to the second state a current has flown through the serial arrangement of the first auxiliary switch and the second auxiliary switch, which is equal to or smaller than the current threshold. The current threshold may equal to or close to zero.

Adapting the delay or non-overlap time between the first control signal and the second control signal may comprise adapting a delay or non-overlap time between an edge of the first control signal and an edge of the second control signal. The delay between corresponding edges of the first control signal and the second control signal (as well as the delay between the corresponding edges between the first auxiliary control signal and the second auxiliary control signal) for a transition between the first state to the second state may be increased, if it is determined that the storage unit has at least partially been discharged. Otherwise, the delay between the corresponding edges may be decreased.

Hence, the non-overlap time between the first switch and the second switch may be adapted in an efficient and precise manner, based on the charging level of a storage unit.

The control means may be configured to charge the storage unit prior to said transition from the first state to the second state, such that the storage voltage at the storage unit corresponds to the default voltage. The storage unit may be such that the storage voltage is indicative of the electrical energy which is stored within the storage unit (as is the case e.g. for a capacitor or a battery cell).

The control means may be configured to compare the storage voltage at the storage unit subsequent to said transition with a reference voltage, in order to determine whether the storage unit has at least partially been discharged. The reference voltage is typically dependent on the default voltage. The storage voltage may vary between the default voltage and the second auxiliary voltage (e.g. ground), wherein the default voltage corresponds to a fully charged storage voltage and wherein the second auxiliary voltage corresponds to a fully discharged storage unit. The reference voltage may lie between the default voltage and the second auxiliary voltage, e.g. at 90%, 80% or less of the default voltage.

As indicated above, the storage unit may be discharged via the serial arrangement of the first auxiliary switch and the second auxiliary switch in accordance to a time constant. The reference voltage may also be dependent on the time constant. By way of example, the reference voltage may correspond to the storage voltage of the storage unit subsequent to a discharging of the storage unit for a certain reference time. The reference time may correspond to or may be dependent on a certain target non-overlap time between the first switch and the second switch.

Hence, the reference voltage may be dependent on a target non-overlap time between the first switch and the second switch. As such, the reference voltage may be used to set the target non-overlap time which is to be set by the control circuitry. The non-overlap time which is set by the control circuitry may be increased if the reference voltage is decreased. On the other hand, the non-overlap time which is set by the control circuitry may be decreased if the reference voltage is increased.

By way of example, the control circuitry may comprise a discharging resistor which can be arranged to discharge the storage unit or an auxiliary storage unit using a discharging switch. The discharging resistor may be used to simulate or copy the resistance of the serial arrangement of the first auxiliary switch and the second auxiliary switch, when both auxiliary switches are closed. In other words, the discharging resistor may be used to simulate the time constant of the discharging of the storage unit, which may occur during a transition from the first state to the second state. The auxiliary storage unit may be a replica of the storage unit. The auxiliary storage unit may comprise a capacitor. Furthermore, the control circuitry may comprise a buffer which is configured to provide the reference voltage.

The control means may be configured to charge the storage unit or the auxiliary storage unit such that the storage voltage at the storage unit or the auxiliary storage unit corresponds to the default voltage. Furthermore, the control means may be configured to control the discharging switch to discharge the storage unit or the auxiliary storage unit for a reference discharging time (wherein the reference discharging time typically depends on the target non-overlap time). In addition, the control means may be configured to provide the storage voltage at the end of the reference discharging time as reference voltage to the buffer. Hence, the reference voltage may be derived directly from the default voltage. This process may be done during the first state or during the second state. In particular, this process may be done when no transition between states occurs. By doing this, a precise reference voltage may be set (which may be independent of temperature and process variations).

The control means may comprise a comparator which is configured to generate an output signal based on the storage voltage and based on the reference voltage, such that a level of the output signal is indicative of whether the storage voltage is higher or lower than the reference voltage. Furthermore, the control means may be configured to adapt the delay between the first control signal and the second control signal based on the output signal. Hence, an efficient means for adapting the non-overlap time is provided.

The control means may be configured to also adapt a delay between the first control signal and the second control signal for controlling a following transition from the second state to the first state, dependent on whether during the transition from the first state to the second state a current has flown through the serial arrangement of the first auxiliary switch and the second auxiliary switch (e.g. dependent on whether the storage unit has at least partially been discharged). In particular, the corresponding edges of the control signals for such a transition may be adapted (e.g. increased or decreased), dependent on whether during said transition from the first state to the second state a current has flown through the serial arrangement of the first auxiliary switch and the second auxiliary switch (e.g. dependent on whether the storage unit has at least partially been discharged or not). Hence, the non-overlap time of the two different transitions (from the first state to the second state, and from the second state to the first state) may be controlled using a single serial arrangement of a first auxiliary switch and a second auxiliary switch.

On the other hand, the control circuitry may comprise a further serial arrangement of a further first auxiliary switch and a further second auxiliary switch, which are controlled using a further first auxiliary control signal and a further second auxiliary control signal, respectively, which are dependent on the first control signal and the second control signal, respectively.

The control means may be configured to determine whether during a transition from the second state to the first state a current has flown through the further serial arrangement of the further first auxiliary switch and the further second auxiliary switch. Furthermore, the control means may be configured to adapt a non-overlap time between the first control signal and the second control signal for controlling a following transition from the second state to the first state, dependent on whether during said transition from the second state to the first state a current has flown through the further serial arrangement of the further first auxiliary switch and the further second auxiliary switch.

Hence, different serial arrangements of auxiliary switches may be provided for controlling the non-overlap time at the different transitions. By doing this, the precision of the control of the non-overlap time may be increased.

In particular, the control circuitry may comprise a further storage unit configured to store electrical energy prior to a transition from the second state to the first state, wherein the further storage unit is discharged if the further first auxiliary switch and the further second auxiliary switch of the further serial arrangements are closed concurrently.

The control means may be configured to determine, subsequent to said transition from the second state to the first state, whether the further storage unit has at least partially been discharged. Furthermore, the control means may be configured to adapt the delay between the first control signal and the second control signal for controlling a following transition from the second state to the first state, dependent on whether the further storage unit has at least partially been discharged.

The control means may be configured to initialize the delay between the first control signal and the second control signal to an initial delay. Such initial delay may be relatively high and may ensure that no overlap between the first and second switches occurs.

For a sequence of transitions from the first state to the second state, the storage unit may be charged prior to a current transition. Furthermore, it may be determined whether the storage unit has at least partially been discharged during the current transition. In addition, the delay between the first control signal and the second control signal may be adapted for the following transition, depending on whether the storage unit has at least partially been discharged during the current transition. Hence, a continuous adaption of the non-overlap time may be performed.

According to a further aspect, a switched-mode power converter configured to convert electrical power is described (e.g. a buck and/or a boost converter). The power converter comprises a first switch and a second switch, which are arranged in series between a first voltage (e.g. an input voltage or an output voltage of the power converter) and a second voltage (e.g. ground). Furthermore, the power converter comprises a control unit which is configured to control the first switch and the second switch to be alternatingly in a first state and in a second state using a first control signal and a second control signal, respectively. The control unit comprises control circuitry described in the present document, for adapting the delay between the first control signal and the second control signal.

According to a further aspect, a method for adapting a non-overlap time for a first switch and a second switch, which are arranged in series and which are controlled using a first control signal and a second control signal, respectively, is described. The method comprises, for a sequence of transitions from the first state to the second state, determining whether during a current transition from the first state to the second state a current has flown through the serial arrangement of the first auxiliary switch and the second auxiliary switch. Furthermore, the method comprises adapting a non-overlap time between the first control signal and the second control signal for controlling a following transition from the first state to the second state, dependent on whether during said transition from the first state to the second state a current has flown through the serial arrangement of the first auxiliary switch and the second auxiliary switch.

In particular, the method may comprise, for a sequence of transitions from the first state to the second state, charging a storage unit prior to a current transition. Furthermore, the method comprises determining whether the storage unit has at least partially been discharged during the current transition. In addition, the method comprises adapting the delay between the first control signal and the second control signal for the following transition, depending on whether the storage unit has at least partially been discharged during the current transition.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF THE DRAWINGS

The invention is explained below in an exemplary manner with reference to the accompanying drawings, wherein.

DESCRIPTION

Figure 1:
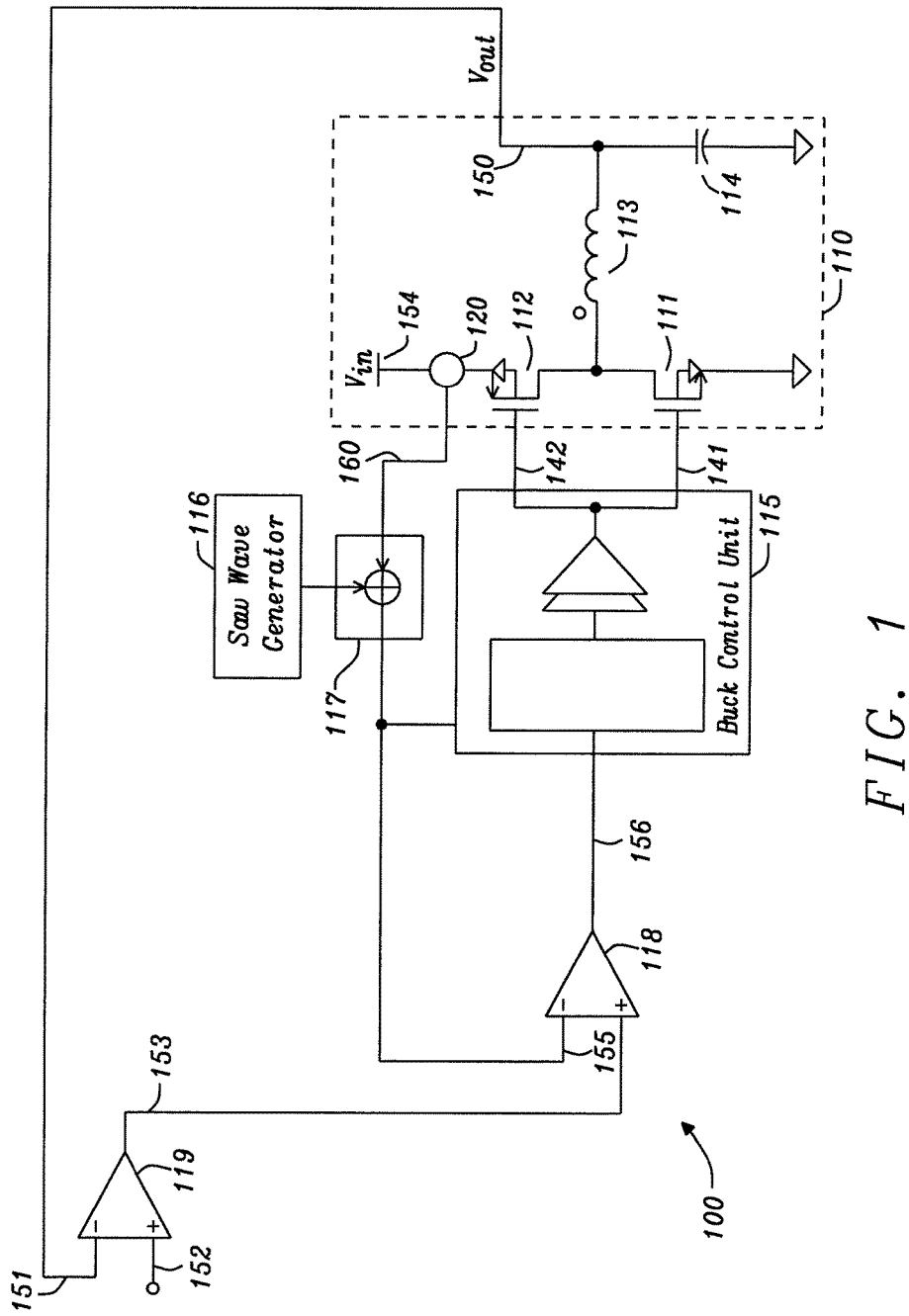
FIG. 1 illustrates a circuit diagram of an example DC-to-DC converter with a PWM controlled loop.

As indicated above, the present document is directed at the technical problem of setting the non-overlap time (NOT) of a serial arrangement of switches in an adaptive manner. In this context, FIG. 1 shows a system 100 comprising a buck converter 110, wherein the system 100 comprises a PWM controlled loop for setting the switching times of the switches 111, 112 of the buck converter 110. It should be noted that even though the following aspects are described in the context of a buck converter 110, the aspects are also applicable to other switched-mode converters and/or DC-to-DC converters, e.g. to other DC-to-DC step-down converters or DC-to-DC step-up converters, and to other systems 100 comprising a serial arrangement of switches 111, 112 which are closed in a mutually exclusive manner.

The buck converter 110 comprises a high side (HS) switch 112 (e.g. a PMOS transistor) and a low side (LS) switch 111 (e.g. a NMOS transistor), as well as a buck inductor 113 and a buck capacitor 114. The duty cycle of the buck converter 110 (i.e. the duty cycle of the high side switch 112) is controlled via a feedback voltage $V_{fb}$ 151 which is equal to (or proportional to) the output voltage $V_{out}$ 150. The feedback voltage 151 may be derived from the output voltage 150 using a voltage divider (not shown in FIG. 1). The feedback voltage $V_{fb}$ 151 is compared to a target voltage 152 using e.g. an error amplifier 119, thereby providing a (cumulated or integrated) error voltage $V_{error}$ 153. In stable operation, when the output voltage $V_{out}$ 150 corresponds to the desired output voltage of the system 100, the error voltage $V_{error}$ 153 should approximate zero or should take on a pre-determined default error value which may be tuned using the target voltage 152. However, in case of load transients, the output voltage $V_{out}$ 150 may dip or peak, thereby causing the error voltage $V_{error}$ 153 to take on absolute values greater than zero or low than zero.

Overall, the error voltage $V_{error}$ 153 may be used to regulate the output voltage $V_{out}$ 150 which is provided by the system 100. The regulation of the output voltage $V_{out}$ 150 may be achieved by controlling the duty cycle of the high side switch 112. This duty cycle may be controlled using the error voltage $V_{error}$ 153. For example, the error voltage $V_{error}$ 153 may be compared with a saw wave voltage 155 having a pre-determined cycle length. The cycle length typically corresponds to the length of the commutation cycle of the buck converter 110 (i.e. the combined length of an on-state and a succeeding off-state of the high side switch 112). The saw wave voltage 155 typically has a maximum voltage $V_{saw}$ at the peak of each saw tooth. The saw wave voltage 155 is compared to the error voltage $V_{error}$ 153 using comparator 118 (e.g. a hysteretic comparator), thereby generating a pulse width modulated (PWM) control signal 156 which is negative (or zero) when the saw wave voltage 155 is greater than $V_{error}$ 153, and positive when the saw wave voltage 155 is smaller than $V_{error}$ 153. The transition from negative to positive may be taken as a trigger for the duty cycle. In particular, the PWM (pulse width modulated) control signal 156 generated by the comparator 118 may be used by the buck control unit 115 to generate the drive signals for the high side switch 112 and the low side switch 111 of the buck converter 110. The regulator may be tuned by selecting the maximum voltage $V_{saw}$ of the saw wave voltage 155 and the reference voltage $V_{ref}$ 152 based on the input voltage $V_{in}$ 154 and the desired output voltage 150.

The regulation of the duty cycle of the buck converter 110 can be enhanced by also taking into account the inductor current, i.e. the current through the inductor 113 of the buck converter 110. For this purpose, the system 100 may comprise current sensing means 120 for sensing the current through the high side switch 112 (which corresponds to the inductor current when the high side switch 112 is in on-state). The current sensing means 120 may e.g. be implemented as a current mirror, which mirrors and possibly amplifies the current through the high side switch 112. The sensed current $I_{sns}$ 160 provided by the current sensing means 120 is therefore typically proportional (or equal) to the current through the high side switch 112 (and to the current through the inductor 113, when the high side switch is in its on-state). At 100% duty cycle of the buck converter 110 and in stable operation, the current through the high side switch 112 is typically constant and corresponds to the input voltage $V_{in}$ 154 divided by the impedance of the load of the system 100.

The sensed current Isns 160 may be added in addition unit 117 to a saw wave signal having the cycle length of the buck converter 110. The adding unit 117 further converts the sum of the saw wave signal and the sensed current $I_{sns}$ 160 into the saw wave voltage $V_{isns}$ 155. The saw wave signal may be generated by a saw wave generator 116 (comprising e.g. a switch (e.g. a transistor) in parallel to a capacitor). Overall, the saw wave generator 116 and the adding unit 117 provide the saw wave voltage $V_{isns}$ 155 which comprises a periodic saw wave signal (generated by the saw wave generator 116) that is offset by a voltage derived from the sensed current $I_{sns}$ 160. As indicated above, $I_{sns}$ 160 is a constant current in case of stable operation of the buck converter 110 at 100% duty cycle. In such cases, the saw wave voltage $V_{isns}$ 155 corresponds to the periodic saw wave signal offset by a constant voltage derived from the constant current $I_{sns}$ 160. In case of a duty cycle lower than 100%, the sense current $I_{sns}$ is zero when the high side switch 112 is in off-state and has a saw like rising shape when the high side switch 112 is in on-state. The saw like rising shape of the sense current $I_{sns}$ 160 during the on-state of the high side switch 112 results from the current throttling properties of the inductor 113. Hence, in cases of a duty cycle of less than 100%, the saw wave voltage $V_{isns}$ 155 is obtained as an overlay of the periodic saw wave signal and an intermittent saw shaped voltage derived from the sensed current $I_{sns}$ 160.

In the system 100 of FIG. 1, the saw wave voltage $V_{isns}$ 155 is compared to the error voltage $V_{error}$ 153 to generate the pulse width modulated (PWM) control signal 156 towards the driver and controller 115 of the buck converter 110. In case of a load transient (e.g. a sudden increase of the load current), the sensed current $I_{sns}$ 160 increases, thereby increasing the slope of the saw wave voltage 155. At the same time, the output voltage $V_{out}$ 150 may drop, leading to an increase of the error voltage $V_{error}$ 153. Both effects tend to move forward the trigger point for the pulse width modulated signal 156, thereby increasing the duty cycle of the buck converter 110 and thereby compensating the effect of the load transient.

The HS switch 112 (also referred to herein as the first switch) and the LS switch 111 (also referred to herein as the second switch) are closed in a mutually exclusive manner using the respective control signals 142, 141. In order to avoid a short circuit between the input voltage 154 (also referred to herein as the first voltage) and ground (also referred to herein as the second voltage), the switches 112, 111 exhibit a non-overlap time (NOT). The NOT should be sufficiently high, in order to reliably prevent a short circuit. On the other hand, the NOT should be small, in order to reduce power dissipation. This may be achieved by adapting the NOT in an automatic manner, e.g. by regulating the NOT.

A possible approach to regulating the NOT is to measure the drain-source voltage across the LS switch 111 at the Lx node and to compare the drain-source voltage with the gate-source voltage of the LS switch 111. The delay between the drop of the drain-source voltage and the rise of the gate-source voltage may then be used as an indicator for the NOT. In particular, this delay may be regulated for regulating the NOT.

However, measuring the drain-source voltage at the Lx node between the HS switch 112 and the LS switch 111 has various disadvantages. Since the Lx node is a switching node and an external node (because of an off-chip inductor 113), parasitics on the Lx node may impact measurement of the NOT through ringing artifacts (such as noise/disturbance issues). Furthermore, for relatively high duty cycles of the HS switch 112, the available time for switching the LS switch 111 is relatively short. This may further reduce the accuracy for measuring the NOT. In addition, a sudden increase in load (thereby discharging the Lx node faster and causing the drain-source voltage at the Lx node to drop faster) leads to the measurement of an increased delay and to an increased indication for the NOT. Hence, load transients may impact the convergence of the regulation loop for regulating the NOT.

In view of the above, a scheme for regulating the NOT is described which is independent of the voltage at the Lx node. It should be noted that the scheme is described for a transition from a HS state (during which the HS switch is closed and the LS switch is open) to a LS state (during which the LS switch is closed and the HS switch is open). The scheme is applicable in an analogous manner for a transition from a LS state to a HS state.

Figure 2:
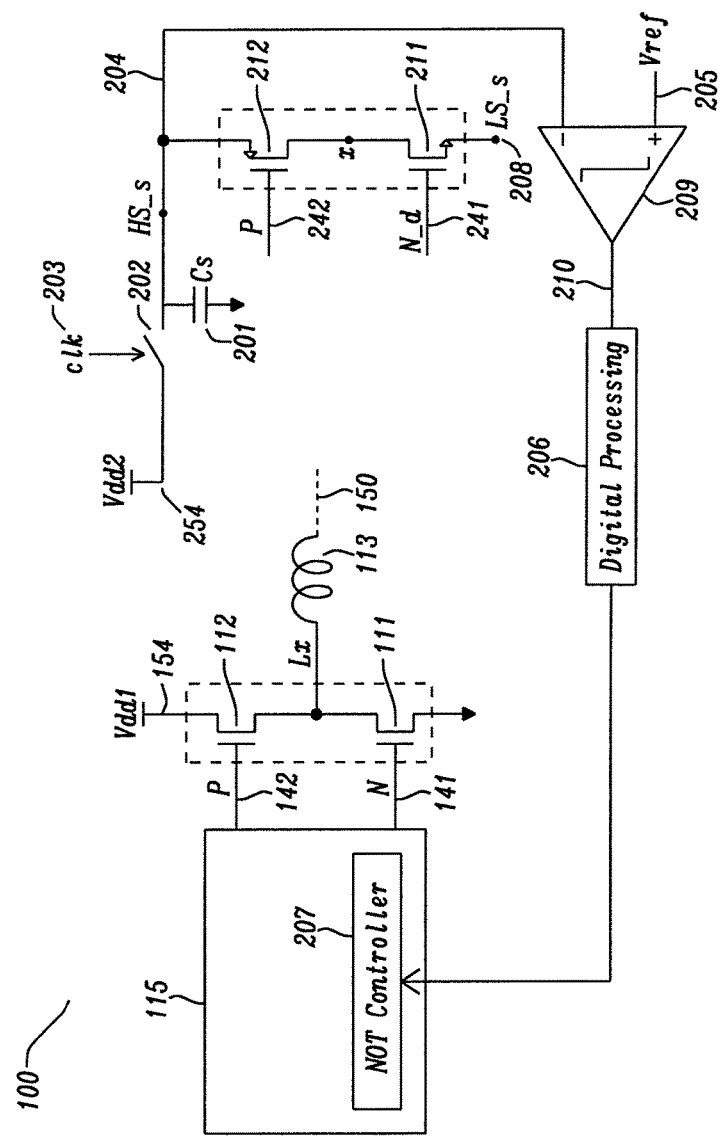
FIG. 2 shows an example power converter with circuitry for adapting the NOT.

FIG. 2 shows example control circuitry for regulating the NOT. The control circuitry comprises a HS replica switch 212 (also referred to as the first auxiliary switch) and a LS replica switch 211 (also referred to as the second auxiliary switch) which are scaled replicas of the HS switch 112 and the LS switch 111, respectively. The replica switches 212, 211 are arranged in series between a default voltage Vdd2 254 and a second auxiliary voltage 208. The default voltage 254 may correspond to or may be different from the input voltage 154. In an analogous manner, the second auxiliary voltage 208 may correspond to or may be different from ground.

The replica switches 212, 211 are controlled using auxiliary control signals 242, 241, respectively. In the illustrated example, the auxiliary control signal P 242 for the HS replica switch 212 corresponds to the control signal P 142 of the HS switch 112. Furthermore, the auxiliary control signal N_d 241 of the LS replica switch 211 corresponds to a delayed version of the control signal N 141 of the LS switch 111.

The control circuitry further comprises a capacitor Cs 201 (being an example for a storage unit) which may be charged to the default voltage 254 by closing the capacitor switch 202, wherein the capacitor switch 202 is controlled using a clock signal 203. In particular, the capacitor Cs 201 may be charged to the default voltage 254 prior to a transition from an LS period, during which the LS switch 111 and the LS replica switch 21 are closed and the HS switch 112 and the HS replica switch 212 are open, to a HS period, during which the LS switch 111 and the LS replica switch 211 are open and the HS switch 112 and the HS replica switch 212 are closed. Hence, the storage voltage 204 of the capacitor 201 corresponds to the default voltage 254 prior to a transition from an LS period to a HS period.

The transition may be such that the HS replica switch 212 and the LS replica switch 211 are closed concurrently. If this is the case, the capacitor 201 is discharged to the second auxiliary voltage 208 via the replica switches 212, 211. The path may exhibit a resistance R, such that the time constant for discharging the capacitor 201 is $1/C_S R$. Hence, an overlap of the LS period and the HS period cause the storage voltage 204 to drop with a certain time constant. On the other hand, if there is no overlap of the LS period and the HS period, the storage voltage 204 remains at the level of the default voltage 254.

The circuitry comprises a comparator 209 which is configured to compare the storage voltage 204 with a reference voltage $V_{ref}$ 205. The reference voltage $V_{ref}$ 205 typically depends on the default voltage 254, e.g. the reference voltage 205 may be equal to 0.8 of the default voltage 254. The output signal 210 of the comparator 209 indicates whether the storage voltage 204 is greater or smaller than the default voltage 254. If the storage voltage 204 is smaller than the default voltage 254, this indicates that an overlap between the LS period and the HS period has occurred. Otherwise, no such overlap has occurred. Hence, the output signal 210 of the comparator 209 indicates whether an overlap situation has occurred or not. The output signal 210 may be submitted to digital processing 206.

In particular, the output signal 210 may be used within the control unit 115, e.g. within a NOT controller 207, to adjust the NOT. Consequently, a regulation loop for the NOT may be provided, wherein the regulation is independent from a measurement of the voltage at the Lx node between the HS switch 112 and the LS switch 111.

Hence, FIG. 2 shows control circuitry for achieving minimum non-overlap time without sensing and/or using the Lx voltage at the Lx node. In particular, FIG. 2 shows circuitry which is configured to replicate an overlap condition and to actively avoid overlap conditions.

The main switches 112, 111 of the power converter 110 are being driven from a control unit 115 that generates 'P' and 'N' control signals 142, 141 which are gate control signals for the HS switch 112 and the LS switch 111. (Scaled) replica switches 212, 211 of the switching devices 112, 111 are provided and controlled by 'P' and 'N_d' auxiliary control signals 241, 242 (which are auxiliary control signals derived from the control signals 142, 141 that drive the main switches 112, 111). The serial arrangement of replica switches 212, 211 is connected between nodes HS_s and LS_s. LS_s is connected to ground (or another suitable auxiliary voltage 208). A capacitor Cs 201 is connected to node HS_s.

Figure 4:
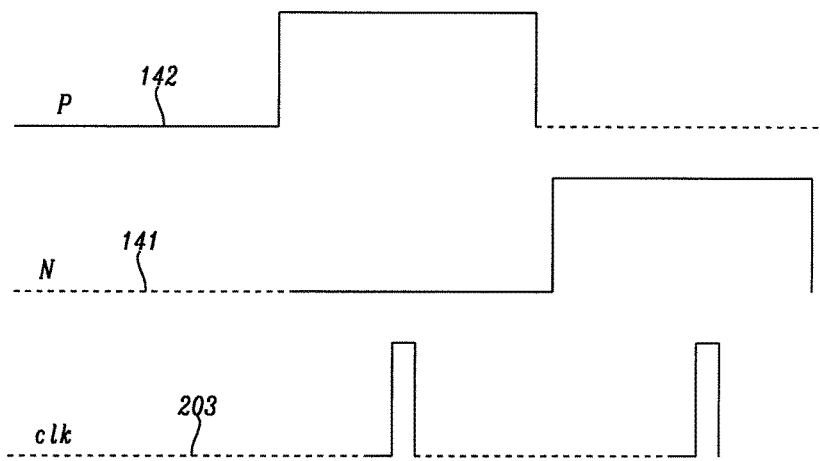
FIG. 4 shows an example clock signal for charging the measurement capacitor.

The purpose of the control circuitry shown in FIG. 2 is to minimize the non-overlap time between the HS and LS switches 112, 111. A potential overlap can occur during the time when there is a transition on the control signals 'P' and 'N'. The capacitor Cs 201 can be charged to a specified default voltage 254 prior to a transition on 'P' or 'N'. FIG. 4 shows example control signals 141, 142 and an example clock signal CLK 203 for driving the capacitor switch 202 for charging the capacitor 201. It should be noted that the control signals 142, 141 shown in FIG. 4 are such that a high level on 141 indicates a closed switch and such that a low level on 142 indicates a closed switch.

If there is some overlap between the control signals 'P' and 'N' during a transition, the node 'HS_s' between the HS replica switch 212 and the capacitor Cs 201 discharges. This can be detected by a comparator 209 which can feed its output signal 210 to the control unit 115. The control unit 115 may be configured to adjust the delay between the control signals 141, 142. In particular, a delay may be increased, if the comparator output signal 210 shows that the HS_s node has been discharged, i.e. that the storage voltage 204 has dropped, below the reference voltage $V_{ref}$ 205). The frequency of the clock signal 203 can be the same or arbitrarily lower than the frequency of the control signal P and N 142, 141 (depending on how fast the minimum non-overlap time is to be reached). In other words, the frequency of the clock signal 203 may be adjusted to adjust the convergence speed of the non-overlap time.

Figure 5:
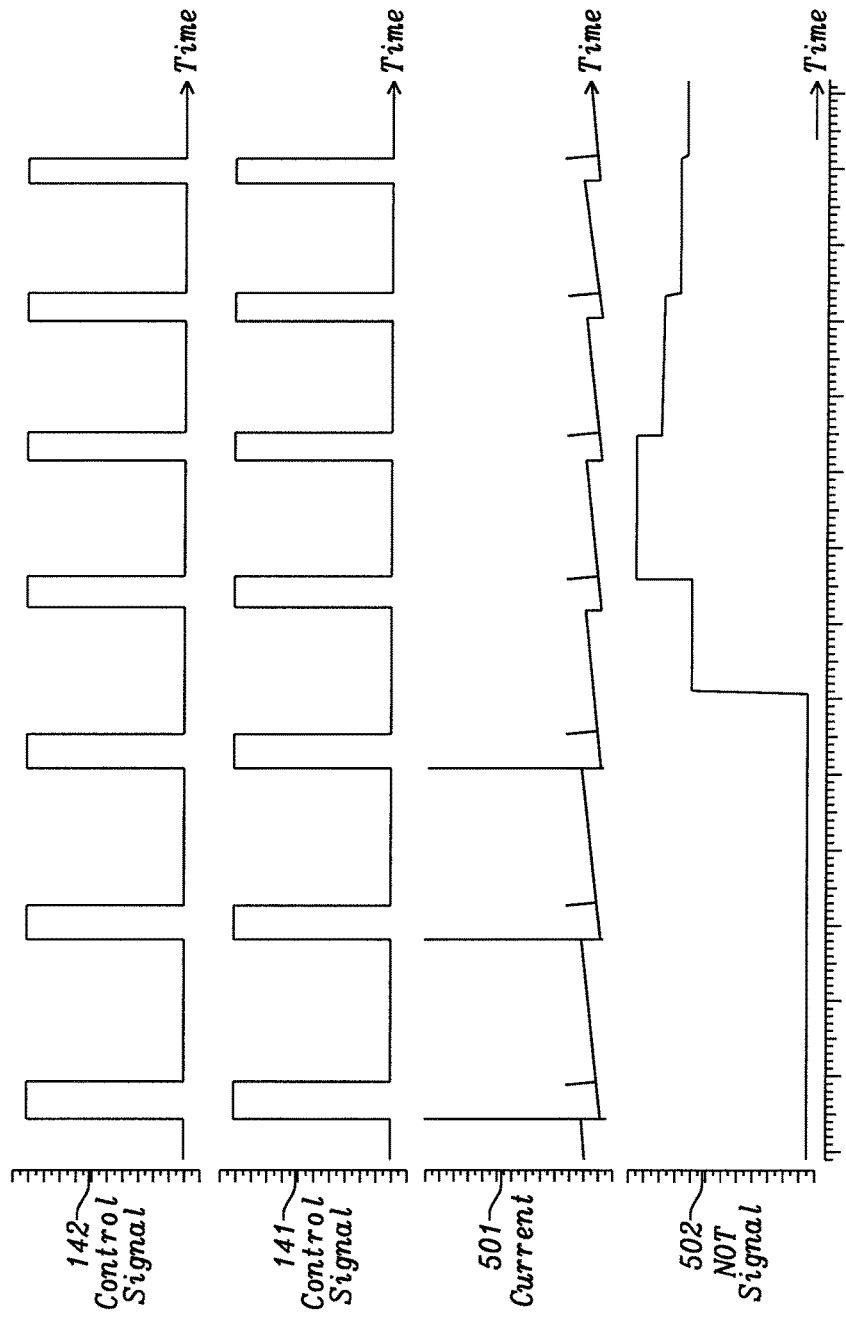
FIG. 5 shows example measurements signals during the control of the NOT.

FIG. 5 illustrates the effect of an adaptive delay or an adaptive NOT control on the shoot-through current of a power converter 110. FIG. 5 shows the control signals 142, 141, wherein the control signal 142 for the HS switch 112 is at high level for opening the HS switch 112 and wherein the control signal 141 for the LS switch 111 is at high level for closing the LS switch 111. Initially, the switches 112, 111 exhibit an overlap, thereby causing shoot-through currents (as can be seen from the peaks in the current 501). Once the control of the NOT is started (indicated by the NOT signal 502), shoot-through current can be avoided. Measurements have shown that a precise control of the NOT may be achieved, even in case of a replica mismatch of the replica switches 211, 212 with regards to the main switches 111, 112. Furthermore, parasitic capacitance and load transients do not impact the regulation quality of the NOT. Hence, a robust and precise NOT regulation may be achieved.

Figure 7:
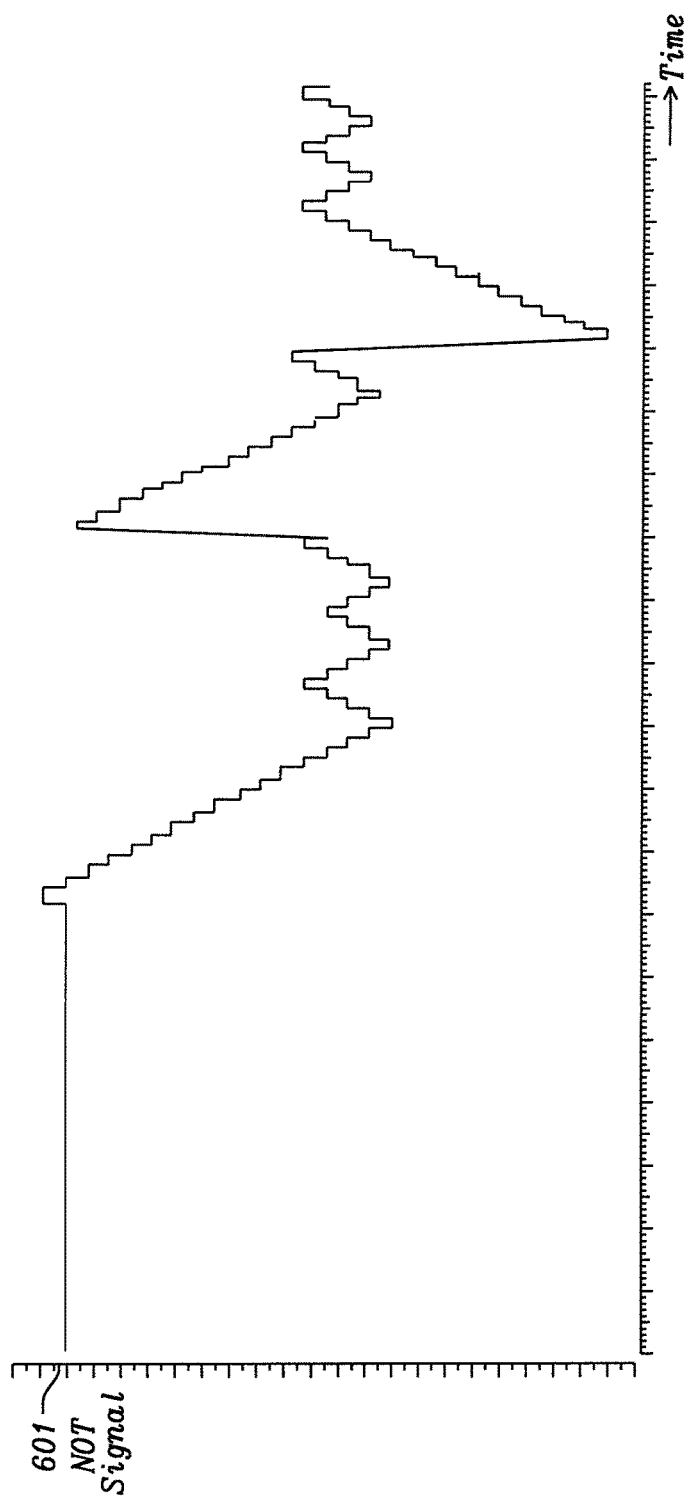
FIG. 7 shows an example temporal evolution of the NOT.

Regulation may be implemented using SAR (successive approximation register) or other techniques such as an up-down counter. By way of example, the delay between the control signals 141, 142 may be increased or decreased by a certain step size, if no overlap is detected or if an overlap is detected, respectively. Such a regulation is illustrated in FIG. 7. The simulation in FIG. 7 starts with a relatively high NOT 601 (of e.g. 3 ns). At a certain time instant, regulation is enabled, which leads to a decrease of the NOT 601. At a later time instant, the NOT 601 is manually increased and it can be seen that the regulation decreases the NOT 601 again. At a later time instant, the NOT 601 is manually decreased (to create an overlap situation). It can be seen once again, that the NOT 601 is regulated to an optimal value.

Figure 6:
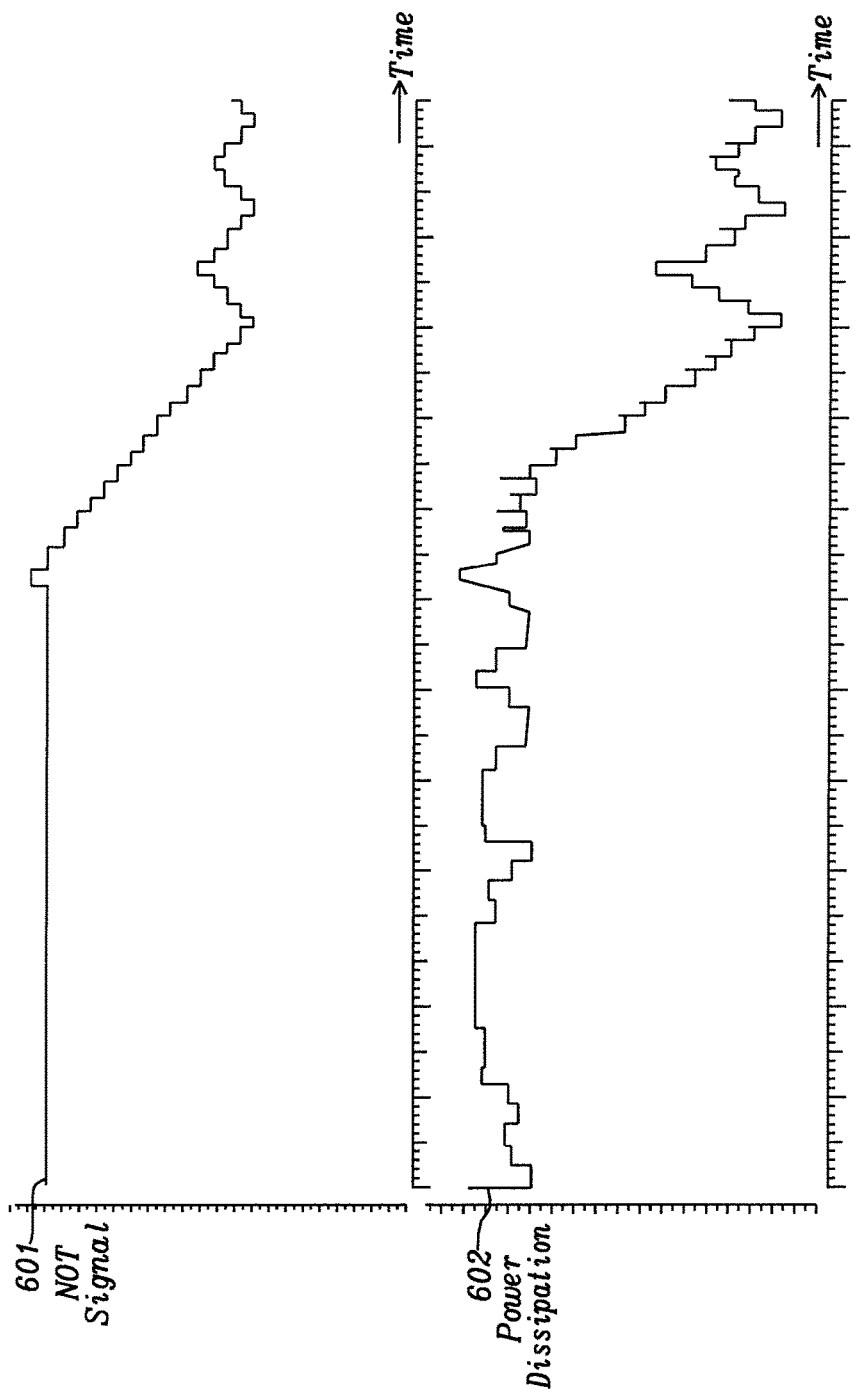
FIG. 6 illustrates the reduction of power dissipation due to a reduction of the NOT.

As indicated above, a reduction of the NOT 601 typically leads to a reduction of power dissipation 602. This is illustrated in FIG. 6. The average amount of power dissipation is typically proportional to the non-overlap time Tnon, the switching time period Tsw, the voltage drop at the body diode Vdio and the output current Iout (e.g. ~Vdio*Iout*Tnon/Tsw). The factor Tnon/Tsw scales the power dissipation proportionally. FIG. 6 shows how the power dissipation 602 can be reduced by reducing the non-overlap time 601.

The capacitance Cs, the reference voltage Vref and the resistance R of the replica switches 211, 212 are design parameters.

One of the replica switches 212, 211 may be controlled using a delayed auxiliary control signal. In the example of FIG. 2 the auxiliary control signal 241 for the LS replica switch 211 is delayed compared to the control signal 111 for the LS switch 111. Alternatively, the auxiliary control signal 242 for the HS replica switch 212 may be delayed compared to the control signal 112 for the HS switch 112.

Figure 8:
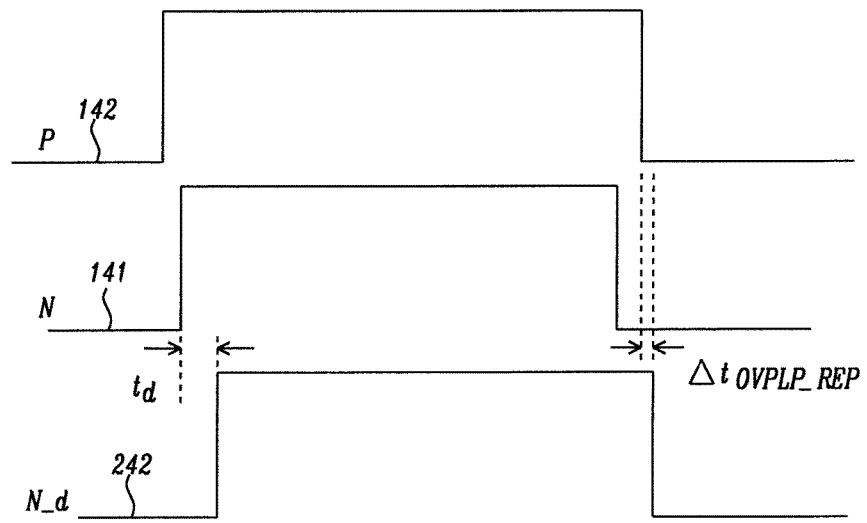
FIG. 8 illustrates the generation of the delayed control signal for the LS switch.

As can be seen from FIG. 8, the delay of the auxiliary control signal 242 N_d by the delay $t_d$ leads to a situation that the falling edges of the auxiliary control signals 242, 241 for the replica switches 212, 211 overlap (e.g. by the overlap time $\Delta T_{OVLP\_REP}$), even though the falling edges of the control signals 142, 141 for the main switches 112, 111 do not yet overlap. Hence, an overlap situation for the replica switches 212, 211 occurs prior to an overlap situation for the main switches 112, 111. In other words, the replica switches 212, 211 may be operated with a NOT which is lower than the NOT of the main switches 112, 111. By doing this, a regulation of the NOT 601 may be achieved without actually causing an overlap situation for the main switches 112, 111.

The reference voltage 205 may be set as $$Vref = V_{DD2} \cdot e^{-\frac{\Delta T_{OVLP\_REP}}{RC_s}}$$

where $\Delta T_{OVLP\_REP}$ is the overlap time of the replica switches 212, 211 that corresponds to the target non-overlap time for the main switches 112, 111. The overlap time of the replica switches 212, 211 is approximately given by $$\Delta T_{OVLP\_REP} \approx \frac{(V_{DD2} - Vref)}{V_{DD2}} \cdot RC_s$$

This overlap time of the replica switches 212, 211 results in the following target non-overlap time for the main switches 112, 111:

$$\Delta T_{NOVLP\_MAIN} \approx t_d - \Delta T_{OVLP\_REP}$$

$\Delta T_{NOVLP\_MAIN}$ is the target non-overlap time of the main switches 112, 111 and $t_d$ is a control signal delay which can be set e.g. to a one gate delay.

As indicated above, an up-down counter may be used as a control algorithm. Such a control algorithm may lead, however, to a non-overlap time which is toggling around the target non-overlap time. A digital logic block may be used to stop such toggling.

$\Delta T_{OVLP\_REP}$ depends on the time constant given by the resistance R and the capacitance Cs. If the resistance and/or capacitance change (e.g. due to a temperature change and/or due to a process variation) this may change the overlap time $\Delta T_{OVLP\_REP}$ of the replica switches 212, 211. If, however, the reference voltage $V_{ref}$ is adapted to track the change of the product RCs, then the dependence the resistance R and the capacitance Cs may be substantially reduced.

Figure 9A:
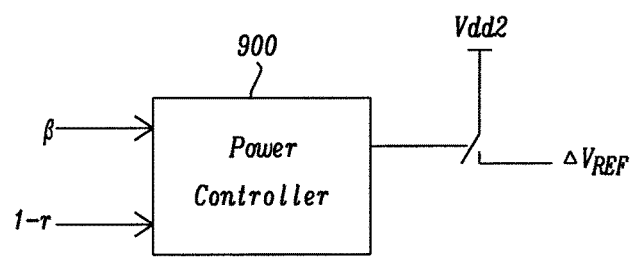
FIG. 9a shows an example circuit for generating the reference voltage.

The change of the reference voltage $\Delta V$ref may be written as follows $$\Delta V\text{ref} = V_{DD2} \cdot \beta(1-r)$$

where r is the selected ratio between $V_{ref}$ to $V_{DD2}$ and where $\beta$ is the percentage change in RCs. $\beta$ may be determined using a circuit which charges a capacitor that is similar to the capacitor 201 using a current source that depends on a similar resistor as R (thereby removing temperature dependence). Having determined $\beta$, $\Delta V$ref can be derived from $V_{DD2}$ using PWM (pulse width modulation) with a duty cycle that is proportional to $\beta(1-r)$. This is illustrated in FIG. 9a with a PWM controller 900 for controlling a switch for deriving $\Delta V$ref from $V_{DD2}$.

Figure 9B:
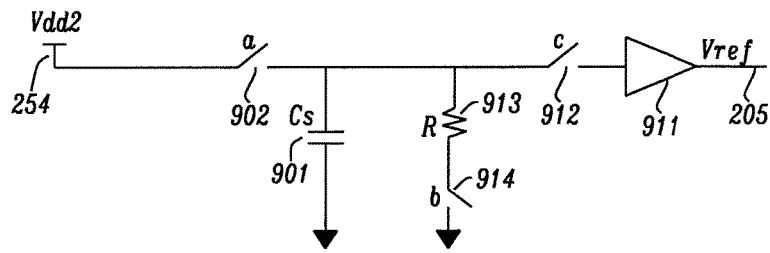
FIG. 9b shows another example circuit for generating the reference voltage.
Figure 9C:
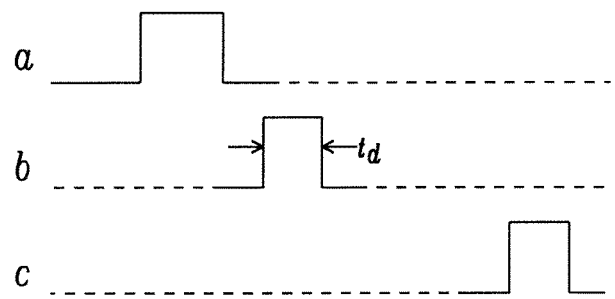
FIG. 9c shows the switch signals of the circuit in FIG. 9b.

An alternative approach to generating $V_{ref}$ is illustrated in FIG. 9b. As seen in the timing diagram of FIG. 9c, the switch 'b' 914 turns on only for an amount of time corresponding to the control signal delay $t_d$. During this time, the capacitor Cs 201 or an auxiliary capacitor 901 discharges through the resistor 'R' 913. The auxiliary capacitor 901 may be charged using the switch a 902. Using the switch 912, the storage voltage is provided to a buffer 911 for storing the reference voltage 205. The reference voltage 205 is then given by $$Vref = V_{DD2} \cdot e^{\frac{-t_d}{RC_s}}$$

The benefit of generating the reference voltage 205 using the circuitry of FIG. 9b is that the full time $t_d$ is needed for the storage voltage 204 to reach Vref. As a result of this, overlap will only exist for the replica switches 122, 121 and not for the main switches 112, 111.

Figure 3:
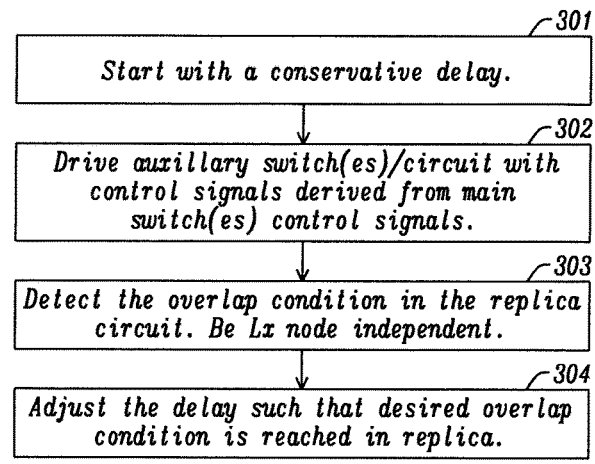
FIG. 3 shows a flow chart of an example method for adapting the NOT.

FIG. 3 shows a flow chart of an example method 300 for adjusting the delay between the control signals 142, 141 for controlling the main switches 112, 111. The method 300 may comprise an initialization step 301 for setting an initial value of the delay. A relatively high or conservative delay, i.e. a relatively high NOT, may be selected. The auxiliary or replica switches 212, 211 may be driven using auxiliary control signals 242, 241 which have been derived from the control signals 142, 141 (step 302). The overlap condition at the replica switches 212, 211 may be determined (step 303), and the delay between the control signals 142, 141 may be adjusted until a desired overlap condition is reached (step 304).

Figure 10:
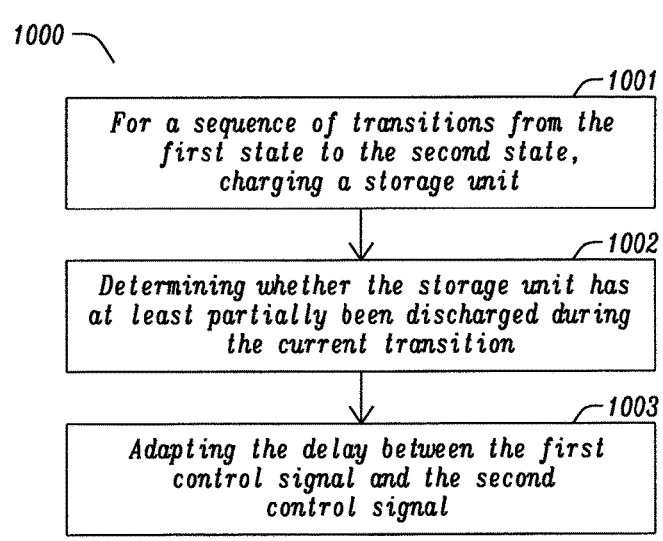
FIG. 10 shows a flow chart of an example method for adapting the non-overlap time of a serial arrangement of switches.

Furthermore, FIG. 10 shows a flow chart of an example method 1000 for adapting a non-overlap time (NOT) for a first switch 112, e.g. a HS switch, and a second switch 111, e.g. a LS switch, which are arranged in series and which are controlled using a first control signal 142 and a second control signal 141, respectively. The first switch 112 and the second switch 111 may be arranged between a first voltage 154, e.g. an HS voltage, and a second voltage, e.g. ground.

Within a first state (e.g. within a HS period or HS state), the first switch 112 may be closed and the second switch 111 may be open. Within a second state (e.g. within a HS period or HS state), the first switch 112 may be open and the second switch 111 may be closed.

The first switch 112 and the second switch 111 may be controlled using the first control signal 142 and the second control signal 141 to be alternatingly in the first state and in the second state.

The method 1000 comprises, for a sequence of transitions from the first state to the second state, charging 1001 a storage unit 201, e.g. a capacitor, prior to a current transition from the first state to the second state. The storage unit 201 is configured to store electrical energy. Furthermore, the storage unit 201 may be discharged (in accordance to a certain time constant), if a first auxiliary switch 212 (e.g. a HS auxiliary switch) and a second auxiliary switch 211 (e.g. a LS auxiliary switch) are closed concurrently. Otherwise, no substantial discharging of the storage unit 201 may occur.

The first auxiliary switch 212 and the second auxiliary switch 211 are arranged in series, and are controlled using a first auxiliary control signal 242 and a second auxiliary control signal 241, respectively. The first auxiliary control signal 242 may be dependent on the first control signal 142. Furthermore, the second auxiliary control signal 241 may be dependent on the second control signal 141. Hence, the first auxiliary switch 212 and the second auxiliary switch 211 may be controlled in accordance to the first switch 112 and the second switch 111. In particular, the first auxiliary control signal 242 and the second auxiliary control signal 241 may correspond to the first control signal 142 and the second control signal 141, apart from an offset of the delay between the control signals. Such an offset may generate an overlap time between the first auxiliary switch 212 and the second auxiliary switch 211, wherein this overlap time may be used to control the NOT of the first switch 112 and the second switch 111.

The method 1000 further comprises determining 1002 whether the storage unit 201 has at least partially been discharged during the current transition. In addition, the method 1000 comprises adapting 1003 the delay between the first control signal 142 and the second control signal 141 (as well as the delay between the first auxiliary control signal 242 and the second auxiliary control signal 241) for the following transition, depending on whether the storage unit 201 has at least partially been discharged during the current transition. Hence, an efficient and precise scheme for setting the NOT of a first switch 112 and a second switch 111 is provided.

Figure 11:
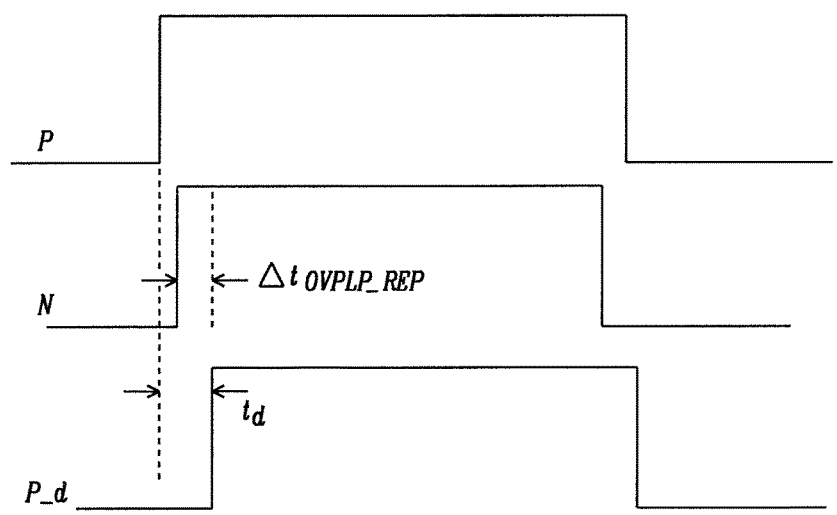
FIG. 11 illustrates the generation of the delayed control signal for the LS switch.

As outlined above, alternatively or in addition, a serial arrangement of auxiliary switches 212, 211 may be provided for monitoring a transition from an LS state to a HS state. For this purpose, the auxiliary control signal P_d for opening the LS auxiliary switch 211 may be delayed compared to the control signal P for opening the LS switch 111. This is illustrated in FIG. 11. As a result of such a delay, the non-overlap time for a transition from an LS state to an HS state may be controlled.

Figure 12:
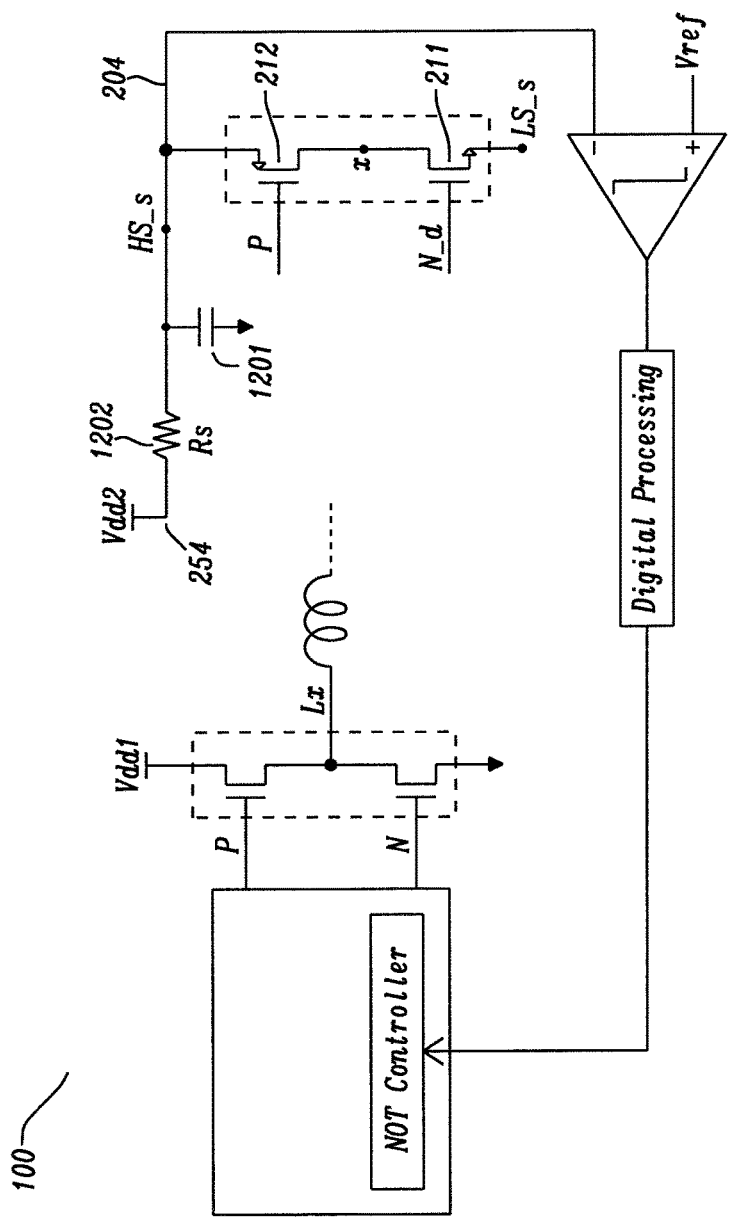
FIG. 12 shows another example power converter with circuitry for adapting the NOT.

As outlined above, the non-overlap time may be adapted dependent on whether during a transition from an HS state to the LS state (or during a transition from the LS state to the HS state) a current has flown through the serial arrangement of the auxiliary switches 212, 211. This may be detected using a storage unit 201 (as illustrated in FIG. 2). FIG. 12 shows a scheme which may be used alternatively or in addition to the scheme of FIG. 2 for detecting an overlap situation of the auxiliary switches 212, 211. A detection resistor 1202 is arranged in series with the serial arrangement of the auxiliary switches 212, 211, such that the intermediate node HS_s is arranged between the detection resistor 1202 and the serial arrangement of the auxiliary switches 212, 211. If no current flows through the serial arrangement of the auxiliary switches 212, 211, the intermediate node HS_s is at Vdd2 254. On the other hand, if a current flows through the serial arrangement of the auxiliary switches 212, 211, the voltage level of the intermediate node HS_s glitches or drops. This glitch of the voltage level may be detected and registered by the control means 119. In particular, it may be detected, whether the voltage level of the intermediate node HS_s glitches during a transition from the HS state to the LS state (or from the LS state to the HS state). The non-overlap time between the control signals P and N may then be adapted accordingly. Hence, an efficient means for detecting an overlap situation of the auxiliary switches 212, 211 may be provided.

The control circuitry of FIG. 12 also comprises a capacitor 1201 which may be used to slow down the glitch or drop of the voltage level at the intermediate node HS_s. By using such a capacitor 1201, the detection of the glitch of the voltage level at the intermedia node HS_s may be simplified and/or rendered more robust.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. Control circuitry for controlling a non-overlap time for a first switch and a second switch, which are arranged in series and which are controlled using a first control signal and a second control signal, respectively; wherein within a first state, the first switch is closed and the second switch is open, and within a second state, the first switch is open and the second switch is closed; wherein the first switch and the second switch are controlled to be alternatingly in the first state and in the second state; wherein the control circuitry comprises, a first auxiliary switch and a second auxiliary switch, which are arranged in series, and which are controlled using a first auxiliary control signal and a second auxiliary control signal, respectively, which are dependent on the first control signal and the second control signal, respectively; and control means configured to
 determine whether during a transition from the first state to the second state a current has flown through the serial arrangement of the first auxiliary switch and the second auxiliary switch; and
 adapt a non-overlap time between the first control signal and the second control signal for controlling a following transition from the first state to the second state, dependent on whether during said transition from the first state to the second state a current has flown through the serial arrangement of the first auxiliary switch and the second auxiliary switch.

2. Control circuitry according to claim 1, wherein
the control circuitry comprises a storage unit configured to store electrical energy prior to a transition from the first state to the second state; wherein the storage unit is discharged via the serial arrangement of the first auxiliary switch and the second auxiliary switch if the first auxiliary switch and the second auxiliary switch are closed concurrently; and the control means are configured to
  determine, subsequent to said transition from the first state to the second state, whether the storage unit has at least partially been discharged; and
  adapt the non-overlap time between the first control signal and the second control signal for controlling a following transition from the first state to the second state, dependent on whether the storage unit has at least partially been discharged.

3. Control circuitry according to claim 2, wherein the control means are configured to
  charge the storage unit prior to said transition such that a storage voltage at the storage unit corresponds to a default voltage ; wherein the storage voltage is indicative of the electrical energy stored within the storage unit; and
  compare the storage voltage at the storage unit subsequent to said transition with a reference voltage, in order to determine whether the storage unit has at least partially been discharged.

4. Control circuitry according to claim 3, wherein
  the storage unit comprises a capacitor; and
  the control circuitry comprises a capacitor switch which is configured to couple the capacitor with a supply for the default voltage prior to said transition.

5. Control circuitry according to claim 3, wherein
  the control means comprise a comparator which is configured to generate an output signal based on the storage voltage and based on the reference voltage, such that a level of the output signal is indicative of whether the storage voltage is higher or lower than the reference voltage; and
  the control means are configured to adapt the non-overlap time between the first control signal and the second control signal based on the output signal.

6. Control circuitry according to claim 3, wherein
  the storage unit is discharged via the serial arrangement of the first auxiliary switch and the second auxiliary switch in accordance to a time constant; and
  the reference voltage is dependent on the time constant.

7. Control circuitry according to claim 3, wherein the reference voltage is dependent on a target non-overlap time between the first switch and the second switch.

8. Control circuitry according to claim 3, wherein
  the control circuitry comprises a discharging resistor which can be arranged to discharge an auxiliary storage unit using a discharging switch;
  the control circuitry comprises a buffer for providing the reference voltage; and
  the control means are configured to
    charge the auxiliary storage unit such that an auxiliary storage voltage at the auxiliary storage unit corresponds to the default voltage;
    control the discharging switch to discharge the auxiliary storage unit for a reference discharging time; and
    provide the auxiliary storage voltage at the end of the reference discharging time as reference voltage to the buffer.

9. Control circuitry according to claim 1, wherein the first auxiliary control signal and the second auxiliary control signal are derived from the first control signal and the second control signal such that a non-overlap time of the first auxiliary control signal relative to the second auxiliary control signal is offset by a control signal delay ($t_d$) compared to a non-overlap time of the first control signal relative to the second control signal.

10. Control circuitry according to claim 1, wherein
  the first auxiliary control signal is equal to the first control signal; and
  the second auxiliary control signal is equal to the second control signal delayed by a control signal delay ($t_d$).

11. Control circuitry according to claim 1, wherein the control means are configured to
  increase the non-overlap time between the first control signal and the second control signal, if it is determined that during said transition from the first state to the second state a current has flown through the serial arrangement of the first auxiliary switch and the second auxiliary switch, which is greater than a pre-determined current threshold; and/or
  decrease the non-overlap time between the first control signal and the second control signal, if it is determined that during said transition from the first state to the second state a current has flown through the serial arrangement of the first auxiliary switch and the second auxiliary switch, which is equal to or smaller than a pre-determined current threshold.

12. Control circuitry according to claim 1, wherein
  the first and second control signals each comprise rising and falling edges for closing or opening the respective first and second switches; and
  adapting the non-overlap time between the first control signal and the second control signal comprises adapting a non-overlap time between an edge of the first control signal and an edge of the second control signal.

13. Control circuitry according to claim 1, wherein the control means are configured to adapt a non-overlap time between the first control signal and the second control signal for controlling a following transition from the second state to the first state, dependent on whether during said transition from the first state to the second state a current has flown through the serial arrangement of the first auxiliary switch and the second auxiliary switch.

14. Control circuitry according to claim 1, wherein
  the control circuitry comprises a further serial arrangement of a further first auxiliary switch and a further second auxiliary switch, which are controlled using a further first auxiliary control signal and a further second auxiliary control signal, respectively, which are dependent on the first control signal and the second control signal, respectively;
  the control means are configured to
    determine whether during a transition from the second state to the first state a current has flown through the further serial arrangement of the further first auxiliary switch and the further second auxiliary switch; and
    adapt a non-overlap time between the first control signal and the second control signal for controlling a following transition from the second state to the first state, dependent on whether during said transition from the second state to the first state a current has flown through the further serial arrangement of the further first auxiliary switch and the further second auxiliary switch.

15. Control circuitry according to claim 14, wherein
  the control circuitry comprises a further storage unit configured to store electrical energy prior to said transition from the second state to the first state; wherein the further storage unit is discharged if the further first auxiliary switch and the further second auxiliary switch of the further serial arrangements are closed concurrently; and the control means are configured to
- determine, subsequent to said transition from the second state to the first state, whether the further storage unit has at least partially been discharged; and
- adapt a non-overlap time between the first control signal and the second control signal for controlling a following transition from the second state to the first state, dependent on whether the further storage unit has at least partially been discharged.

16. Control circuitry according to claim 2, wherein the control means are configured to
- initialize the non-overlap time between the first control signal and the second control signal to an initial non-overlap time;
- for a sequence of transitions from the first state to the second state,
  - charge the storage unit prior to a current transition;
  - determine whether the storage unit has at least partially been discharged during the current transition; and
  - adapt the non-overlap time between the first control signal and the second control signal for the following transition, depending on whether the storage unit has at least partially been discharged during the current transition.

17. Control circuitry according to claim 1, wherein
- the control circuitry comprises a detection resistor which is arranged in series with the serial arrangement of the first auxiliary switch and the second auxiliary switch; and
- means for detecting a voltage at an intermediate node between the detection resistor and the serial arrangement of the first auxiliary switch and the second auxiliary switch during a transition from the first state to the second state.

18. A switched-mode power converter configured to convert electrical power, wherein the power converter comprises,
- a first switch and a second switch which are arranged in series between a first voltage and a second voltage; and
- a control unit which is configured to control the first switch and the second switch to be alternatingly in a first state and in a second state using a first control signal and a second control signal, respectively; wherein within the first state, the first switch is closed and the second switch is open, and within the second state, the first switch is open and the second switch is closed; wherein the control unit comprises control circuitry according to any previous claim, for adapting a non-overlap time between the first control signal and the second control signal.

19. A method for adapting a non-overlap time for a first switch and a second switch, which are arranged in series and which are controlled using a first control signal and a second control signal, respectively; wherein within a first state, the first switch is closed and the second switch is open, and wherein within a second state, the first switch is open and the second switch is closed; wherein the first switch and the second switch are controlled to be alternatingly in the first state and in the second state; wherein the method comprises, for a sequence of transitions from the first state to the second state,
- determining whether during a current transition from the first state to the second state a current has flown through the serial arrangement of the first auxiliary switch and the second auxiliary switch; and
- adapting a non-overlap time between the first control signal and the second control signal for controlling a following transition from the first state to the second state, dependent on whether during said transition from the first state to the second state a current has flown through the serial arrangement of the first auxiliary switch and the second auxiliary switch.

20. The method of claim 19, wherein the method comprises
- charging a storage unit prior to the current transition; wherein the storage unit stores electrical energy; wherein the storage unit is discharged if a first auxiliary switch and a second auxiliary switch are closed concurrently; wherein the first auxiliary switch and the second auxiliary switch are arranged in series, and are controlled using a first auxiliary control signal and a second auxiliary control signal, respectively, which are dependent on the first control signal and the second control signal, respectively;
- determining whether the storage unit has at least partially been discharged during the current transition; and
- adapting the non-overlap time between the first control signal and the second control signal for the following transition, depending on whether the storage unit has at least partially been discharged during the current transition.

* * * * *